United States Patent [19]

Balasubramanian

[11] 4,225,224
[45] Sep. 30, 1980

[54] PROCESS AND APPARATUS FOR LASER ILLUMINATION OF PRINTING PLATES

[75] Inventor: N. Balasubramanian, Saratoga, Calif.

[73] Assignee: The United States of America as represented by the Secretary of the Army, Washington, D.C.

[21] Appl. No.: 20,145

[22] Filed: Mar. 13, 1979

[51] Int. Cl.³ .................... G01D 9/32; G03B 27/44; G11B 7/00
[52] U.S. Cl. .................................. 355/77; 346/76 L; 346/108; 350/285
[58] Field of Search .................... 358/285–297, 358/302, 80; 346/76 L, 108, 77 E; 354/10; 355/53, 52, 2, 67, 77; 101/401.1, 467; 350/285; 40/2.2

[56] References Cited

U.S. PATENT DOCUMENTS

| | | | |
|---|---|---|---|
| 3,220,013 | 11/1965 | Harris | 346/76 L |
| 3,314,073 | 4/1967 | Becker | 346/108 X |
| 3,350,156 | 10/1967 | Adams | 350/285 X |
| 3,621,133 | 11/1971 | Baker et al. | 350/285 X |
| 3,636,251 | 1/1972 | Daly et al. | 358/297 |
| 3,653,067 | 3/1972 | Anderson et al. | 346/108 |
| 3,679,818 | 7/1972 | Courtney-Pratt | 346/76 L X |
| 3,687,543 | 8/1972 | Cochran et al. | 355/52 |
| 3,739,370 | 6/1973 | Wolff | 350/285 X |
| 3,751,587 | 8/1973 | Insler et al. | 346/76 L |
| 3,803,637 | 4/1974 | Martin et al. | 346/76 L |
| 3,805,275 | 4/1974 | Kiemle et al. | 346/108 |
| 3,836,709 | 9/1974 | Hutchison | 101/467 X |
| 3,838,912 | 10/1974 | Arimoto et al. | 350/285 |
| 3,842,195 | 10/1974 | Takahashi et al. | 346/108 X |
| 3,893,129 | 7/1975 | Endo et al. | 346/77 E |
| 3,894,756 | 7/1975 | Ward | 40/2.2 X |
| 3,961,334 | 6/1976 | Whitby et al. | 346/76 L X |
| 3,985,439 | 10/1976 | Kiemle | 346/76 L X |
| 4,002,829 | 1/1977 | Hutchison | 346/76 L X |

*Primary Examiner*—Donald A. Griffin
*Attorney, Agent, or Firm*—Darrell E. Hollis

[57] ABSTRACT

A laser projection and printing system wherein a laser beam is focused on the scan center of an X-Y galvo-deflector, passes through a condensing lens to a transparency to be projected, and is transmitted to an imaging lens for projection to a large format plate. The scanning galvinometer, condenser, and imaging lens render the laser beam effective to project the small transparency to a large format plate.

8 Claims, 1 Drawing Figure

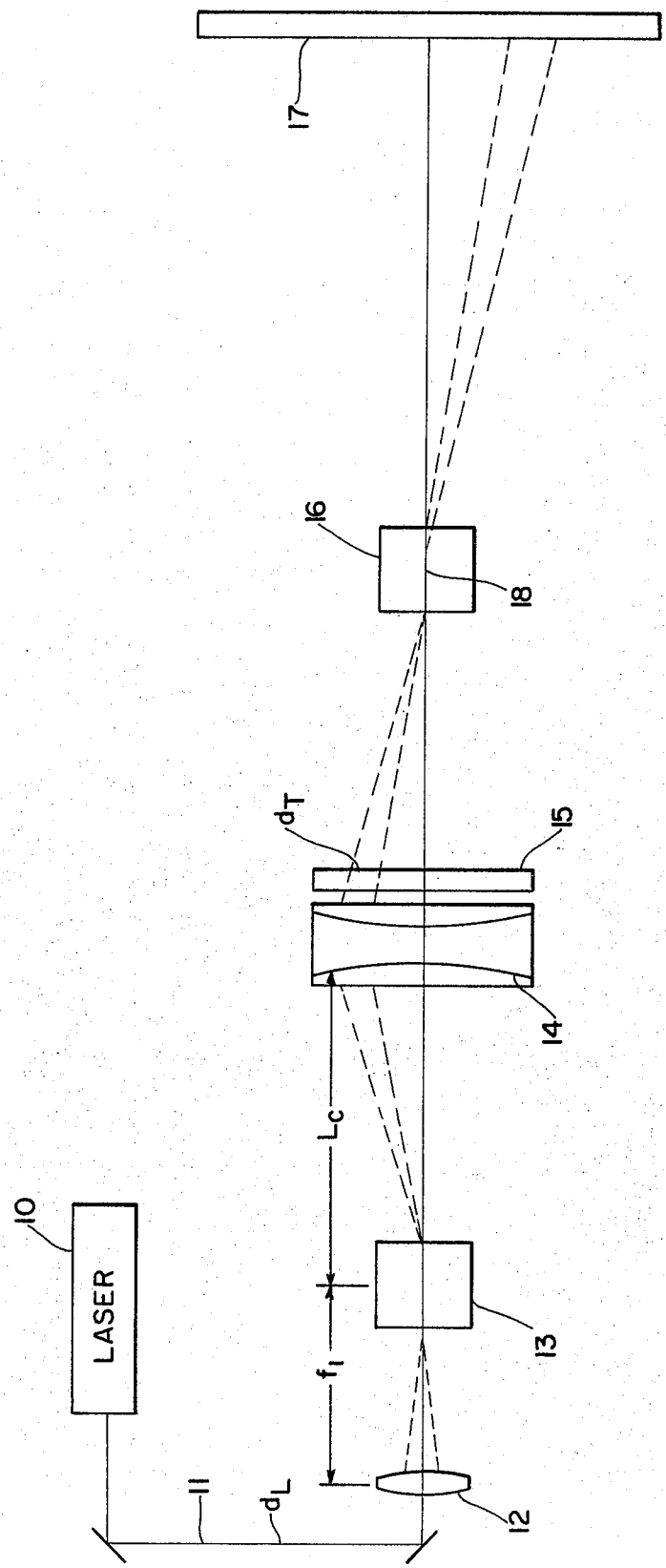

PROCESS AND APPARATUS FOR LASER ILLUMINATION OF PRINTING PLATES

BACKGROUND OF INVENTION

In the manufacture of large format press plates as used in map making, it has been conventional to produce these plates by direct contact printing with large format transparencies and a very high intense arc light source. The use of large format transparencies has been required because projection printing with arc light sources would require power levels which would burn up a small scale transparency. Further, illumination of an entire transparency with an enlarged laser beam for projection printing is also impractical because of the very high laser power levels that would be required. Further, in any contemplated whole transparency laser system, there would be laser speckel artifacts which would derrogate the fidelity of the plate.

Also known in the art are laser projection systems which rely upon various techniques to modulate the laser beam as it is scanned across the plate. Such a system is shown in U.S. Pat. No. 3,836,709—Hutchison. In modulation systems such as that shown in the Hutchison patent, there is first required use of a partially reflecting mirror (beam splitter) which must be placed between the imaging lens and the recording medium, or press plate. This, however, is a poor optical practice which leads to geometric distortions of the image projected onto the recording medium because of refractions in the mirror plate due to off axis light beams. Further, if such a plate were not flat to within a portion of one wavelength, there will be phase effects which result in additional geometric distortions of the projected image. Further, in systems such as the one shown in Hutchison, the input transparency must be translated in two orthoganal directions by a transparency driving mechanism 18 for the purpose of generating precise control signals for the scanning apparatus. Any noise or nonlinearities or drift will result in geometric distortions of the projected image.

Systems such as Hutchison are complex, which results in higher costs, and have lower levels of projection fidelity.

In the art of manufacturing mapping press plates, systems such as the one shown in the Hutchison patent are not useful because of their inherent inaccuracies. In such map plates, there is a requirement for extreme accuracy of the reproduction, and elimination of any geometric distortions.

The present contact printing production techniques used in the manufacture of maps may require as many as twenty 24"×30" photographic film sheets to prepare color separated negatives associated with one topographic map. The sheets are relatively expensive, and the voluminous storage requirements are substantial.

SUMMARY OF INVENTION

In the present invention, there is used a direct printing approach which is much simpler and superior to the electrical modulation technique. By the use of the direct approach of the present invention, the resulting press plate image is vastly superior in terms of geometric fidelity which is of the utmost importance in the manufacture of maps. By the use of this system, it is possible to produce large format press plates without the intermediate step of preparing a full scale film negative for direct contact printing.

The present invention utilizes a laser beam or source of culminated light and a galvo-deflector or scanner to move the laser across the face of a transparency, and an imaging lens to focus the beam on a large format plate. As the beam moves across the transparency, it is modulated directly by the transparency.

A laser beam is focused on the scan center of an X-Y galvo-deflector and the light from the galvo-deflector is passed through a condensing lens prior to reaching the transparency to be projected. As the light passes through the transparency, it continues to the center of an imaging lens for projection to the large format plate. It has been found that, by passing the light from the condensing lens directly to the center or entrance pupil of the imaging lens, there is no relative illumination variations at the plane of the transparency due to vignetting.

Further, in this invention, it has been found that a simple relationship exists for the determination of the illumination at the plane of the transparency which is placed between the culminating lens and the imaging lens. By this relationship, it has been found that the laser image projection system can be easily modified by degree of precision or magnification as desired.

In this invention, the use of the coherent transfer function characteristics of the imaging lens system provides for very little information loss from the input transparency during imaging. Further, since only a small area of the transparency is illuminated at any time, the power density at the image plane (of the beam) is sufficient to permit exposure directly onto the printing plate.

In this system, the time average integration of the coherent noise effects at the final image plane remove the typical artifacts introduced by projection systems utilizing very intense, noncoherent arc light sources.

Still further, the galvinometer deflector system inherent instabilities have no effect on the final geometric fidelity and the geometric fidelity of the final image is therefore determined purely by the distortion characteristics of the final imaging lens. The final image distortion is further limited by always directing the beam to the center of the entrance pupil of the final imaging lens.

Small scale transparencies may be used in this projection system. Use of this precise laser projection will allow the use of microfische sized images for direct projection enlargement to large format press plate sizes. The use of small transparencies allows for small volume storage which is not possible with current techniques.

It should also be recognized that the use of this system in the production of maps is an advance which is directly transferrable to graphic arts in general because most graphic arts do not require the same precision and exacting requirements associated with mapping products.

DESCRIPTION OF THE DRAWING

The FIGURE is a schematic diagram of the laser projection system that is used to produce a large format plate.

DESCRIPTION OF THE PREFERRED EMBODIMENT

In this projection system, a source of laser light 10 produces a laser beam 11 which has a diameter $d_L$. This beam may be produced by any suitable source of laser energy, such as a two watt Argon ion laser of the type known as a Lexel Model 85 Argon.

A first lens 12 ($L_1$) receives the laser beam 11 and focuses the beam on an X-Y galvo-deflector apparent scan center. The lens 12 may be planoconvex or doublet lens with a focal length of 500 mm. and a diameter of 1 cm. The focal length of the lens 12 ($L_1$) is shown on FIG. 1 as $f_1$.

The X-Y galvo-deflector (13) may be orthoganally mounted scanners. The X-Y Galvo-deflector (13) may be a pair of General Scanning G-300 Scanners with associated drivers. The focused and deflected laser beam then moves from the galvo-deflector 13 to the condensing lens 14. The condensing lens 14 may be two planoconverse lenses or culminating lenses. These lenses may be two F No. 4 six-inch diameter lenses mounted back to back in order to form the condensing system. Also shown on FIG. 1 is a distance $L_c$ which is the distance from the scan center of the galvo-deflector 13 to the back surface of the condensing lens 14.

An input transparency 15 is located close to the condenser system 14, and the light passes through this transparency. The light from the transparency 15 is then projected to the center (18) of the entrance pupil of the imaging lens 16. By projection of the light to the center of the entrance pupil, there are no relative illumination variations at the plane of the transparency due to vignetting. The final imaging lens may have a focal length of 120 mm.

The moving laser light passes through the transparency (15) which modulates the beam intensity received by the large format plate 17. The X-Y galvo-deflector (13) moves the laser beam in a predetermined pattern across the transparency thereby scanning all areas with a moving beam which will not destroy the transparency. The scan in the X-Y directions fills the entire aperture or area of the transparency (15).

In the system described hereinabove, the illumination area on the transparency can be approximated by the following formula:

$$d_t = (L_c \times d_l)/f_1$$

Where $d_t$ is the illumination are of the transparency, $L_c$ is the distance between the scan center of the X-Y galvo-deflector 13, the condenser back surface 14 and $d_1$ is the diameter of the laser beam 11, and $f_1$ is the focal length of lens 12.

While the invention has been particularly shown and described with reference to a preferred embodiment, it will be understood by those skilled in the art that various changes in form and details may be made therein without departing from the spirit and scope of the invention.

What is claimed is:

1. A laser printing and projection system comprising in combination:
   (a) a laser beam light source;
   (b) a first lens for focusing the culminated beam from the laser;
   (c) an X-Y galvo-deflection system having an apparent scan center for deflecting said focused, culminated beam from said first lens;
   (d) a second condensing lens for receiving the deflected focused culminated light from said X-Y galvo-deflection system;
   (e) a third imaging lens for receiving the light from said second condensing lens;
   (f) an input transparency placed between said culminating lens and said imaging lens; and
   (g) a printing plate placed beyond said imaging lens for receiving said culminated focused, scanned and imaged light which has passed through said transparency.

2. The laser printing projection system of claim 1 wherein said light from said condensing lens passes through the center of said imaging lens entrance pupil at all positions of said X-Y galvo-deflector.

3. The laser printing system of claim 1 wherein said transparency modulates said deflected culminated beam of light.

4. The laser printing and projection system of claim 1 wherein said first lens focuses the culminated light at the apparent scan center of the X-Y galvo-deflector system.

5. The laser printing and projection system of claim 1 wherein the illumination area on the plane of the transparency is equal to the product of the diameter of the laser beam, and the distance between the scan center and the back surface of the condenser, divided by the focal length of said first focusing lens.

6. The laser printing and projection system of claim 1 wherein the said galvo-deflector deflects the cone of diverging light in both the X and Y directions to fill the entire aperature or area of the transparency.

7. The apparatus of claim 1 wherein said transparency is placed next to said condensing lens.

8. A method of projecting small transparencies to large format printing plates comprising the steps of:
   (a) focusing a laser beam on the apparent scan center of a moving X-Y galvo-deflection system;
   (b) condensing the moving light from said X-Y galvo-deflection system;
   (c) modulating said moving light from said condensing lens by passing through a transparency which is to be projected;
   (d) passing the modulated light from said transparency to an imaging lense center entrance pupil;
   (e) imaging said focused, deflected and modulated light which has passed through said transparency upon a large format plate.

* * * * *